US 6,657,301 B2

(12) United States Patent
Maekawa et al.

(10) Patent No.: US 6,657,301 B2
(45) Date of Patent: Dec. 2, 2003

(54) CONTACT STRUCTURE, METHOD OF FORMING THE SAME, SEMICONDUCTOR DEVICE, AND METHOD OF MANUFACTURING THE SAME

(75) Inventors: Kazuyoshi Maekawa, Tokyo (JP); Yasuhiro Kanda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/022,352

(22) Filed: Dec. 20, 2001

(65) Prior Publication Data

US 2003/0006504 A1 Jan. 9, 2003

(30) Foreign Application Priority Data

Jul. 4, 2001 (JP) ......................................... 2001-203919

(51) Int. Cl.[7] ..................... H01L 21/4763; H01L 21/44; H01L 23/48
(52) U.S. Cl. ..................... 257/751; 438/649; 438/660; 438/683; 438/630; 257/757; 257/762
(58) Field of Search ........................... 438/630, 649, 438/655, 659, 660, 661, 682, 683, 685; 257/751, 754, 757, 762

(56) References Cited

U.S. PATENT DOCUMENTS

| 4,910,578 | A | * | 3/1990 | Okamoto |
| 4,926,237 | A | * | 5/1990 | Sun et al. |
| 6,124,639 | A | * | 9/2000 | Domenicucci et al. |
| 6,288,430 | B1 | * | 9/2001 | Oda |
| 6,391,767 | B1 | * | 5/2002 | Huster et al. |

FOREIGN PATENT DOCUMENTS

| JP | 8-31768 | 2/1996 |
| JP | 10-55982 | 2/1998 |
| JP | 2000-223568 | 8/2000 |

* cited by examiner

Primary Examiner—Ha Tran Nguyen
(74) Attorney, Agent, or Firm—McDermott, Will & Emery

(57) ABSTRACT

A ternary metal silicide layer is formed between a silicon substrate and a barrier layer, in a contact structure including: a substrate having a silicon part; an insulating layer formed on the substrate, and having a connection hole that reaches the silicon part, a barrier layer formed at least on an inner surface of the connection hole; and a conductive member buried inside the barrier layer.

21 Claims, 6 Drawing Sheets

PRIOR ART

CONTACT STRUCTURE, METHOD OF FORMING THE SAME, SEMICONDUCTOR DEVICE, AND METHOD OF MANUFACTURING THE SAME

BACKGROUND OF THE INVENTION

1. Field of the Invention

The present invention relates to a contact structure, a method of manufacturing such a contact structure, a semiconductor device, and a method of manufacturing such a semiconductor device. More specifically, the present invention relates to a contact structure that can inhibit the elevation the resistance of the contact even at the time of performing heat-treatment, a method of manufacturing such a contact structure, a semiconductor device, and a method of manufacturing such a semiconductor device, a semiconductor device that utilizes such a contact structure, and a method of manufacturing such a contact structure.

2. Background Art

The present invention relates to a contact structure typically used for the connection between the diffused layer in the Si substrate of a semiconductor device and metal wirings formed on the upper surface of the insulating layer on the Si substrate; and a method of manufacturing such a contact structure. The present invention will be described below referring to such a case as an example.

FIGS. 5 and 6 are schematic sectional views for illustrating a conventional contact structure.

A method of forming such a contact structure will be described below referring to FIG. 5.

First, an insulating layer 4 is formed on the surface of a Si substrate 2, for example, by a CVD method. The insulating layer 4 is subjected to exposure to the light, etching, on the like to form a connection hole 6. As FIG. 5A shows, the connection hole 6 passes through the insulating layer 4, and the Si substrate 2 is exposed on the bottom 6A of the connection hole 6.

Next, on the inner wall of the connection hole 6, a TiN/Ti film 14 is formed by a sputtering technique as a barrier layer for preventing diffusion and reaction between the conductive member and the Si substrate 2.

If the Si substrate 2 is maintained at a high temperature during the formation of the TiN/Ti film 14, Ti in the TiN/Ti film 14 reacts with Si in the Si substrate 2 at the bottom 6A of the connection hole 6, where the Ti film laminated earlier contacts the Si substrate 2, to form a silicide as FIG. 5B shows. Even if the Si substrate 2 is not maintained at a high temperature, if the Si substrate 2 is subjected to a heat treatment at a high temperature in a subsequent process, Ti in the TiN/Ti film 14 reacts with Si in the Si substrate 2 to form a silicide. Thus, a TiSi$_2$ film or a TiSi film 32 is formed on the bottom 6A of the connection hole 6.

Next, as FIG. 5C shows, the connection hole 6 filled with W, a conductive member 16, by a CVD method or the like. In other words, W is deposited on the entire surface of the TiN/Ti film 14 until the connection hole 6 is filled.

As described above, a contact structure as FIG. 5C shows is formed.

If the TiSi$_2$ or TiSi film 32 formed on the bottom of the connection hole 6 is subjected to a heat treatment at 700° C. or higher during the formation of the TiN/Ti film 14, aggregation occurs, whereby the contact resistance at the TiSi$_2$ or TiSi film 32 elevates. Furthermore, if the aggregation of TiSi$_2$ or TiSi proceeds, voids are formed in this area, and the breakdown of electrical connection may be considered.

In order to solve such problems, as FIG. 6 shows, a method of forming a CoSi$_2$ film, which has the heat resistance higher than the heat resistance of a TiSi$_2$ film, is formed on the bottom of the connection hole 6, may be used instead of the TiSi$_2$ or TiSi film 32.

In this method, first as FIG. 6A shows, a Co film 34 is formed on the upper surface 4A of the insulating film 4, the bottom 6A of the connection hole 6, and the side 6B of the connection hole 6 by sputtering or the like, prior to the formation of the barrier layer 14.

Next, as FIG. 6B shows, heat treatment is performed to allow the Co film 34 to react with the Si substrate, to form a CoSi film 36A on the bottom 6A of the connection hole 6. Then, as FIG. 6C shows, the Co film 34 that has not reacted with the Si substrate is removed, leaving the CoSi film 36A on the bottom 6A of the connection hole 6. Thereafter, the heat treatment is performed again to allow the CoSi film 36A with Si to form a CoSi$_2$ film 36.

Next, as FIG. 6D shows, a TiN/Ti film 14 is formed as a barrier layer. Furthermore, a conductive member 16 is deposited on the surface of the TiN/Ti film 14, and fills the connection hole 6. Thus, a contact structure as shown in FIG. 6E is formed.

However, even if such a CoSi$_2$ film 36 is used, CoSi$_2$ aggregates at a heat-treatment temperature above 750° C. As a result, the contact resistance of the CoSi$_2$ film 36 elevates, or voids are formed, and electrical connection may be broken.

SUMMARY OF THE INVENTION

Figure 1:
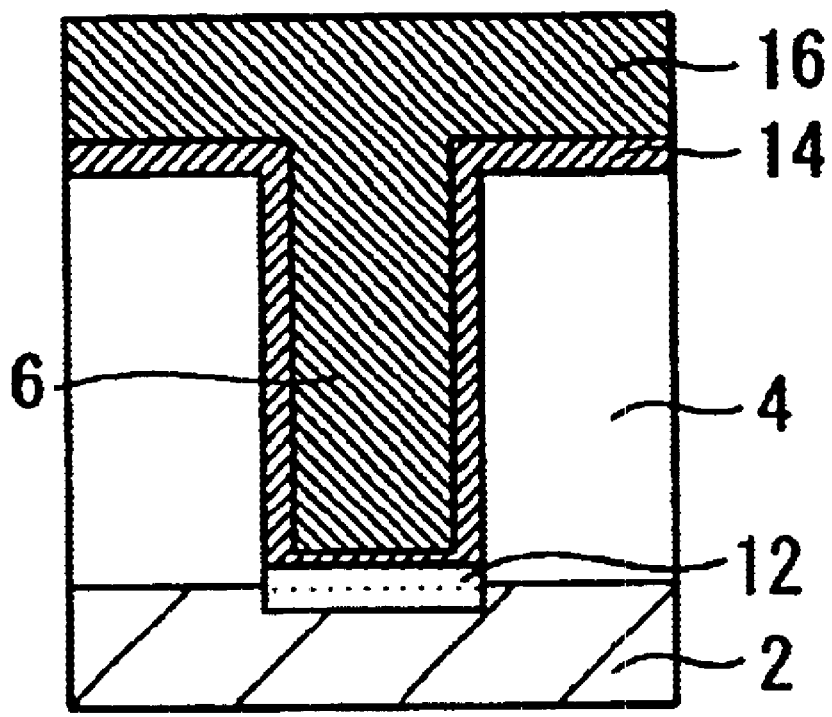
FIG. 1 is a schematic sectional view for illustrating a contact structure according to First Embodiment of the present invention.

In a conventional contact structure, as described above, since the metal silicide film formed on the bottom of the connection hole aggregates when the heat-treatment temperature is high, problems of the elevation of resistance or the formation of voids arise.

In the actual process of manufacturing semiconductor devices, however, heat treatment is performed not only in the formation of the barrier layer, but also in various steps, and the heat-treatment temperature often reaches 750° C. or higher.

Therefore, an object of the present invention is to provide a stable contact structure that can minimize the elevation of resistance even in the heat treatment at 700° C. or higher, and a method of manufacturing such a contact structure, thus preventing the elevation of contact resistance, and the breakdown of electrical connection at the bottom of the connection hole.

According to one aspect of the present invention, a contact structure comprises a silicon substrate, an insulating layer formed on the substrate, and having a connection hole that reaches the silicon substrate, a barrier layer formed at least on the inner surface of the connection hole, a ternary metal silicide layer is formed between the substrate and the barrier layer; and a conductive member buried inside the barrier layer.

In another aspect of the present invention, in a method of forming a contact, an insulating layer is formed on an Si substrate. A connection hole that reaches the silicon substrate is formed on the insulting layer. A ternary metal silicide layer on the surface of the Si substrate on the bottom of the connection hole. A barrier layer is formed at least on the inner surface of the connection hole. A conductive member is buried inside the barrier layer.

Other and further objects, features and advantages of the invention will appear more fully from the following description.

DETAILED DESCRIPTION OF THE PREFERRED EMBODIMENTS

To summarize the present invention, a ternary metal silicide layer is formed on the bottom of a connection hole formed on an insulating layer, then a barrier layer is formed in the connection hole, and a conductive member is buried in the connection hole.

The embodiments of the present invention will be described below referring to the drawings. In the drawings, the same or corresponding parts are denoted by the same reference numerals or characters, and the description thereof will be simplified or omitted.

First Embodiment

FIG. 1 is a schematic sectional view for illustrating a contact structure according to First Embodiment of the present invention.

In FIG. 1, reference numeral 2 denotes a Si substrate, and 4 denotes an insulating layer formed on a surface of the Si substrate 2. Reference numeral 6 denotes a connection hole formed in the insulating layer 4. The connection hole 6 is formed so as to pass through the insulating layer 4, and reach the Si substrate 2.

Although the insulating layer 4 may be of a suitable film as required, $SiO_2$, which excels in insulating characteristics and is electrically stable, is used here.

Reference numeral 14 denotes a TiN/Ti film formed as a barrier layer on the upper surface 4A of the insulating layer 4 and on the inner surface of the connection hole 6. Reference numeral 16 denotes a conductive member that is deposited on a surface of the TiN/Ti film 14, and fills the connection hole 6, and W is used here.

The TiN/Ti film 14 is formed as a barrier layer for preventing diffusion and reaction occurring between W, which is the conductive member 16 to be buried, and Si contained in the Si substrate 2 or $SiO_2$ in the insulating layer 4.

Reference numeral 12 denotes a ternary metal silicide formed between the TiN/Ti film 14 and the Si substrate 2. The ternary metal silicide layer 12 is formed by allowing a refractory metal compound to react with Si, so as to prevent the elevation of resistance or the formation of voids even if the heat treatment is performed at 750° C. or higher. Here, $Co_xW_y$ is used as the refractory metal compound, and $Co_xW_ySi_z$ film formed by allowing the $Co_xW_y$ to react with Si is used as the ternary metal silicide layer.

FIG. 2 is a schematic sectional view for illustrating the process for forming the contact according to First Embodiment of the present invention. A method of forming the contact according to First Embodiment will be described below referring to FIG. 2.

First, an insulating layer 4 is formed on the upper surface of a Si substrate 2 by, for example, a CVD technique. Although $SiO_2$ is used here as the insulating layer 4 as described above, the material of the insulating layer 4 is not limited to $SiO_2$. Also, the technique is not limited to CVD, but other techniques may be used.

Figure 2A:
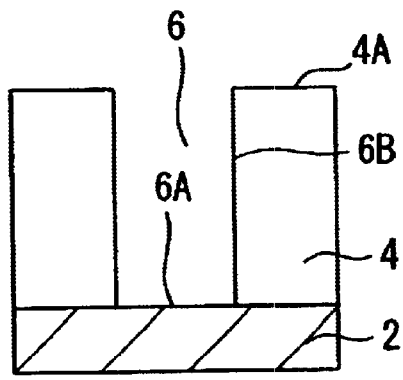
FIG. 2A to FIG. 2E are schematic sectional views for illustrating the process for forming the contact according to First Embodiment of the present invention.

Next, as FIG. 2A shows, a connection hole 6 is formed in the insulating layer 4.

First, a photoresist (not shown) is applied on the surface of the insulating layer 4. The pattern for opening the connection hole 6 is transferred to the photoresist by projection exposure. The insulating layer 4 is subjected to etching using thus formed resist pattern on the photoresist as the mask to form connection hole 6.

Although projection exposure is used here, the technique for transferring the resist pattern is not limited to projection exposure, but other techniques such as electron-beam exposure may be used.

As FIG. 2A shows, the connection hole 6 formed here passes through the insulating layer 4, and the Si substrate 2 is exposed at the bottom 6A of the connection hole 6.

Figure 2B:
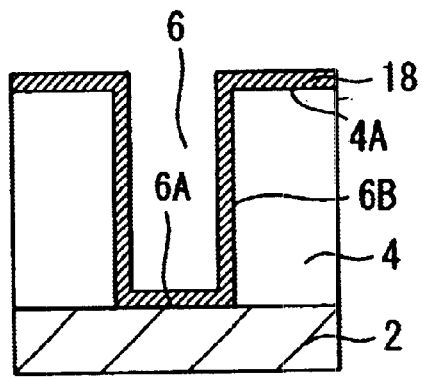

Next, as FIG. 2B shows, a $Co_xW_y$ film 18, which is a refractory metal compound, is formed.

Here, a $Co_xW_y$ target is used for depositing $Co_xW_y$ on the surface of the substrate 2 on which the insulating layer 4 having the connection hole 6 has been formed as shown in FIG. 2A by sputtering. Thereby, $Co_xW_y$ is deposited on the upper surface 4A of the insulating layer 4, the bottom 6A of the connection hole 6, and the side 6B of the connection hole 6, that is, on the entire area exposed to the surface, and the $Co_xW_y$ film 18 is formed.

Figure 2C:
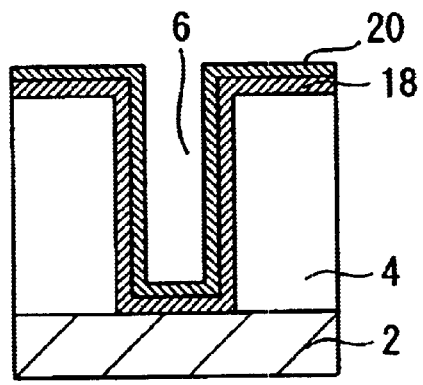

Furthermore, as FIG. 2C shows, a TiN film 20 is formed by sputtering on the entire surface of the $Co_xW_y$ film 18 including the portion formed on the inner surface of the connection hole 6. The TiN film 20 is formed for preventing the oxidation of the $Co_xW_y$ film 18.

It is preferable that the formation of the $Co_xW_y$ film 18 and the TiN film 20 by sputtering is carried out continuously in a vacuum in order to prevent the oxidation of the $Co_xW_y$ film 18. It is also preferable that the directive sputtering known as collimation sputtering or long-throw sputtering, or by ionization sputtering is employed for forming the $Co_xW_y$ film 18 and the TiN film 20 especially for forming a $CoSi_2$ film on the bottom of the contact hole or in the groove of the gate oxide film. However, the technique is not limited to sputtering, but other techniques may be used.

Next, the $Co_xW_y$ film 18 is silicified.

Here, the $Co_xW_y$ film 18 formed on the area of the bottom 6A of the connection hole 6 contacting the Si substrate 2 is allowed to react with Si in the contacting Si substrate 2 by a first heat treatment at about 400° C. to 450° C., to form a $Co_xW_ySi_z$ film 12, which is a ternary metal silicide layer.

The heat treatment at about 400° C. to 450° C. for the silicification of the $Co_xW_y$ film 18 is herein referred to as the first heat treatment.

The first heat treatment is a heat treatment for forming a monosilicide film, i.e., $Co_xW_ySi$. Thereby, the necessary $Co_xW_ySi$ film can be separated from the unnecessary $Co_xW_y$ film, and the unnecessary portion can be removed selectively by subsequently performed etching.

Figure 2D:
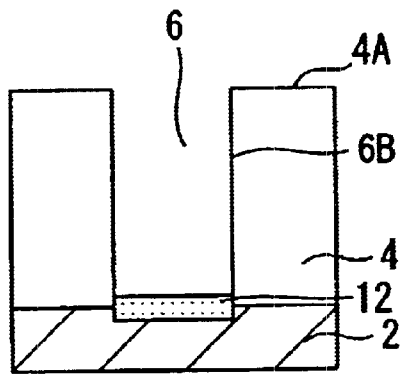

Next, as FIG. 2D shows, the part of the $Co_xW_y$ film 18 that has not been silicified, and the TiN film 20 formed for preventing oxidation are removed. Here, the $Co_xW_y$ film 18 and the TiN film 20 are removed by etching using a sulfuric acid-hydrogen peroxide solution, thereby leaving the $Co_xW_ySi_z$ film 12 formed on the bottom 6A of the connection hole 6.

The substrate is further subjected to a second heat treatment at about 650° C. to 900° C.

Thereby, the $Co_xW_ySi_z$ film 12 formed at the area where the bottom 6A of the connection hole 6 contacts the Si substrate 2 is further silicified, and the $Co_xW_ySi_z$ film 12 is stabilized.

The heat treatment at about 650° C. to 900° C. for stabilizing the $Co_xW_ySi_z$ film 12 is herein referred to as the second heat treatment.

The second heat treatment is a heat treatment for converting the monosilicide $Co_xW_ySi$ film to the more stable disilicide $Co_xW_ySi_2$ film.

Figure 2E:
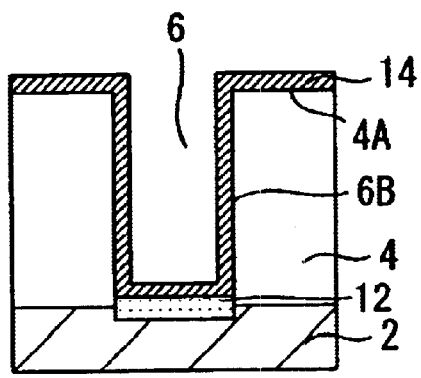

Next, as FIG. 2E shows, a TiN/Ti film 14, which is a barrier layer, is formed.

First, Ti is used as a target to deposit Ti on the upper surface 4A of the insulating film 4, the side 6B of the connection hole 6, and the upper surface of the $Co_xW_ySi_z$ film 12 by sputtering in a vacuum to form a Ti film. Then, the atmosphere is switched to nitrogen gas, and TiN is deposited on the surface of the Ti film by sputtering to form a TiN/Ti film 14.

During the formation of the TiN/Ti film 14, although the Si substrate 2 is maintained at a high temperature, no $TiSi_2$ film is formed on the bottom 6A of the connection hole 6 as in conventional methods, because the $Co_xW_ySi_z$ film 12 has already been formed on the bottom 6A of the connection hole 6 contacting the Si substrate 2.

Next, a conductive member 16, W, is deposited on the entire surface of the TiN/Ti film 14, including the portion formed on the inner surface of the connection hole 6, and the contact as shown in FIG. 1 is formed.

By the above-described method, the $Co_xW_ySi_z$ film 12, which is a ternary metal silicide layer of a high melting point, is formed between the TiN.Ti film 14 on the bottom 6A of the connection hole 6 and the Si substrate 2. Therefore, even during various heat treatments in the semiconductor manufacturing process, aggregation does not occur in the bottom 6A of the connection hole 6, and a stable contact structure can be obtained.

In the description of First Embodiment, a $Co_xW_y$ film is used for forming the ternary metal silicide layer. However, the present invention is not limited thereto, but other binary refractory metal compounds, such as $Co_xMo_y$, may be silicified to form the ternary metal silicide layer.

However, if the resistance to various heat treatments in the semiconductor manufacturing process, stability, and resistance values are considered, Co is preferable as the major component, and as the binary refractory metal compounds, the combination of Co and other refractory metals is preferable.

Also in First Embodiment, the first and second heat treatments are performed to form the $Co_xW_ySi_z$ film. The reason is that aggregation occurs easily if a disilicide $Co_xW_ySi_z$ film is formed from a $Co_xW_y$ film by one heat treatment. Therefore, in order to prevent the occurrence of aggregation, it is preferable to divide the heat treatment into the first and second steps. However, the present invention is not limited thereto, but the $Co_xW_ySi_z$ film may be formed by one heat treatment if aggregation can be inhibited.

The reason why the temperature of the first heat treatment is 400° C. to 450° C., and the temperature of the second heat treatment is 650° C. to 900° C. is to prevent the occurrence of aggregation, and to obtain the stable $Co_xW_ySi_z$ film. However, heat-treatment temperature beyond the above-described ranges may be used if the stable ternary metal silicide film can be obtained.

Also in First Embodiment, a TiN.Ti film is used as the barrier layer, and W is used as the conductive member, the materials are not limited thereto, but other metals may also be used.

The description of metals used in First Embodiment is also applicable to other embodiments herein.

Second Embodiment

FIG. 3 is a schematic sectional view for illustrating the process for forming the contact according to Second Embodiment of the present invention. A method of forming the contact according to Second Embodiment will be described below referring to FIG. 3.

First, an insulating layer having a connection hole 6 is formed on an upper surface of a Si substrate 2 as in FIG. 2(a).

Figure 3A:
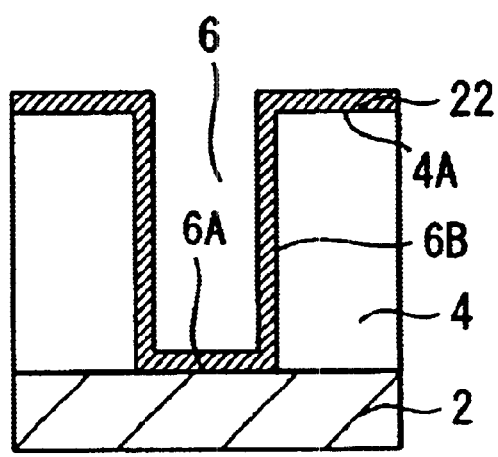
FIG. 3A to FIG. 3D are schematic sectional views for illustrating the process for forming the contact according to Second Embodiment of the present invention.

Next, as FIG. 3A shows, a Co film is formed.

Here, Co is deposited by sputtering using a Co target to form the Co film 22 on the upper surface 4A of the insulating layer 4, the bottom 6A of the connection hole 6, and the side 6B of the connection hole 6, that is, the entire portion exposed to the surface.

Figure 3B:
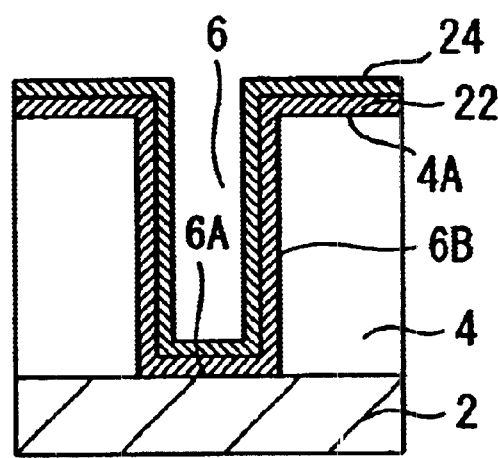

Next, as FIG. 3B shows, a W film 24, which is a refractory metal, is formed on the entire surface of the Co film 22 including the portion formed on the inner surface of the connection hole 6.

Here, W is deposited by sputtering using a W target as in the formation of the Co film to form the W film 24 to the surface of the Co film 22 formed on the inner surface of the connection hole 6.

Figure 3C:
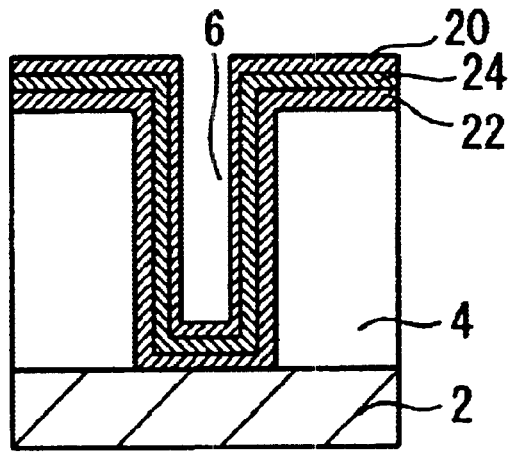

Furthermore, as FIG. 3C shows, a TiN film 20 is formed by sputtering on the entire surface of the W film 24 for preventing oxidation.

It is preferable that the Co film 22, the W film 24, and the TiN film 20 are formed continuously in a vacuum for preventing oxidation. It is also preferable that the formation of the Co film 22, the W film 24, and the TiN film 20 is carried out by sputtering, especially by collimation sputtering or long-throw sputtering, or by ionization sputtering; however, the technique is not limited to sputtering.

Next, the reaction of the Co film 22 with the W film 24, and the silicification thereof are performed simultaneously.

Here, a first heat treatment at 400° C. to 450° C. is performed. Thereby, the Co film 22 is allowed to react with the W film 24 to form a $Co_xW_y$ film. At the same time, the Si substrate 2 reacts with the Co film 22 and the W film 24 on the bottom 6A of the connection hole 6 where the Co film 22 contacts the Si substrate 2, and a $Co_xW_ySi_z$ film 12 is formed.

Figure 3D:
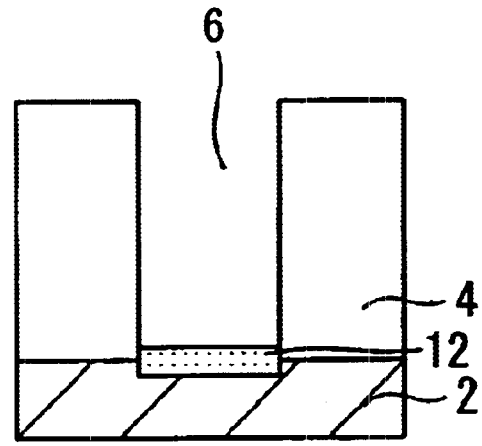

Next, as FIG. 3D shows, the part of the $Co_xW_y$ film that has not been silicified, and the TiN film 20 used for preventing oxidation are removed.

Here, the $Co_xW_y$ film and the TiN film 20 are removed by etching using a sulfuric acid-hydrogen peroxide solution, thereby leaving the $Co_xW_ySi_z$ film 12 formed on the bottom 6A of the connection hole 6.

The substrate is further subjected to a second heat treatment at about 650° C. to 900° C.

Thereby, the $Co_xW_ySi_z$ film 12 formed at the area where the bottom 6A of the connection hole 6 contacts the Si substrate 2 is stabilized.

Further on the $Co_xW_ySi_z$ film 12, a TiN/Ti film 14 is formed, and W is buried as the conductive member 16 to obtain a contact structure as the contact structure shown in FIG. 1.

Since other parts are the same as in First Embodiment, description will be omitted.

The $Co_xW_ySi_z$ film 12, which is a ternary metal silicide layer, can also be formed by the above-described method. Therefore, even during the first and second heat treatments, or other heat treatments, no aggregation occurs on the bottom of the connection hole, and the elevation of contact resistance can be prevented.

Here, although the W film 24 is formed on the surface of the Co film 22, the material is not limited to W, but other refractory metal, such as Mo, can be used in place of W. However, as in First Embodiment, it is preferable that the Co film is formed first, and that Co is the major component.

Third Embodiment

FIG. 4 is a schematic sectional view for illustrating a process for forming the contact according to Third Embodiment of the present invention. A method of forming the contact according to Third Embodiment will be described below referring to FIG. 4.

First, an insulating layer having a connection hole 6 is formed on the upper surface of a Si substrate 2 as in FIG. 2A.

Figure 4A:
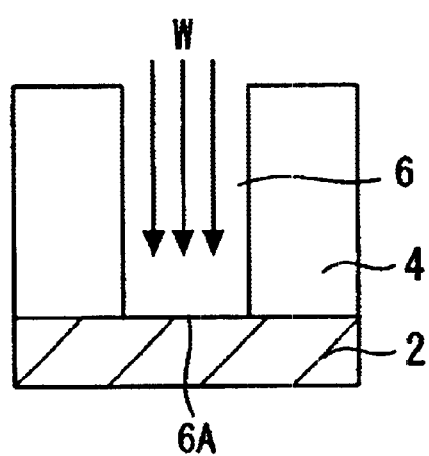
FIG. 4A to FIG. 4D are schematic sectional views for illustrating a process for forming the contact according to Third Embodiment of the present invention.

Next, as FIG. 4A shows, W is implanted from the opening of the connection hole 6 into the Si substrate 2 exposed at the bottom 6A of the connection hole 6.

Figure 4B:
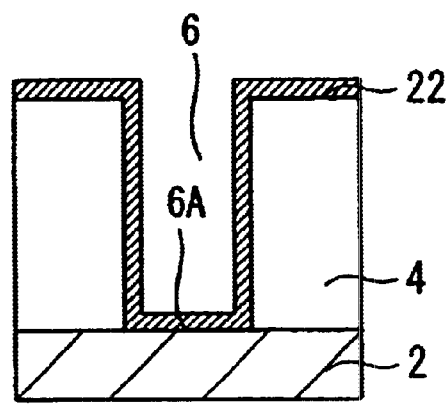

Next, as FIG. 4B shows, a Co film 22 is formed.

Here, as in Second Embodiment, the Co film 22 is formed by sputtering on the upper surface 4A of the insulating layer 4, the bottom 6A of the connection hole 6, and the side 6B of the connection hole 6, that is, the entire portion exposed to the surface.

Figure 4C:
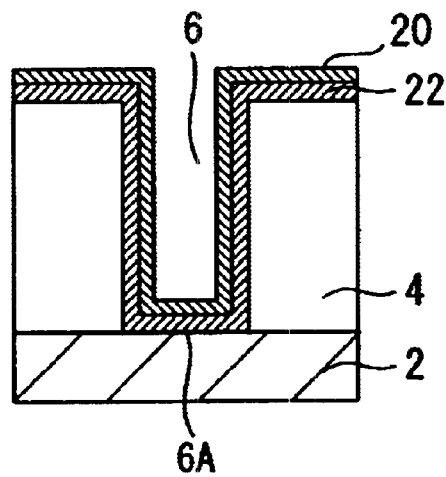

Furthermore, as FIG. 4C shows, a TiN film 20 is formed on the surface of the Co film 22 for preventing oxidation.

Next, silicification is performed to form a $Co_xW_ySi_z$ film 12, which is a ternary metal silicide layer, is formed.

Here, by a first heat treatment at 400° C. to 450° C., the Co film 22, Si in the Si substrate 2 in the bottom 6A of the connection hole 6, and W previously implanted into the Si substrate 2 are allowed to react each other so as to form the $Co_xW_ySi_z$ film 12.

Figure 4D:
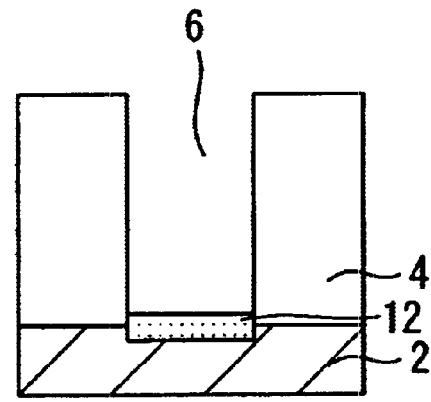
Figure 5A:
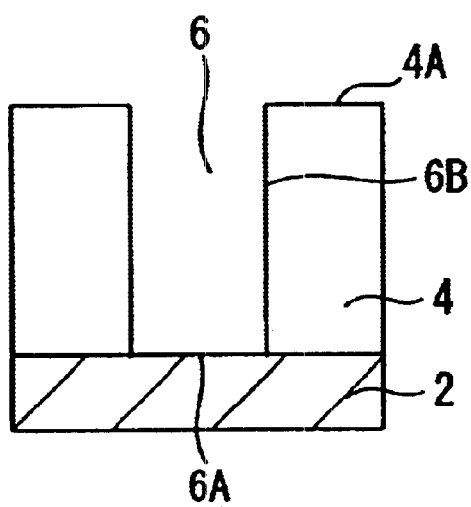
FIG. 5A to FIG. 5C are schematic sectional views for illustrating a conventional contact structure.
Figure 5B:
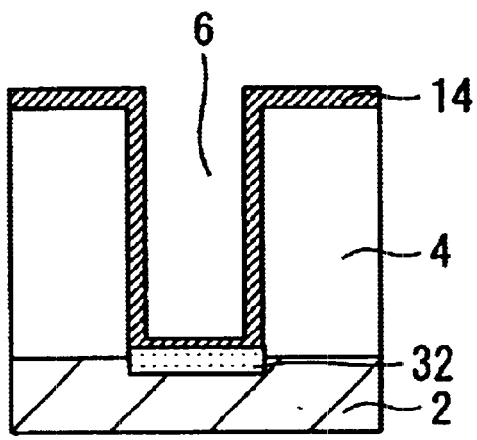
Figure 5C:
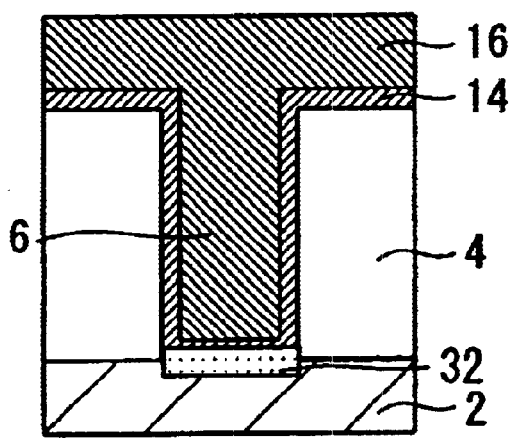
Figure 6A:
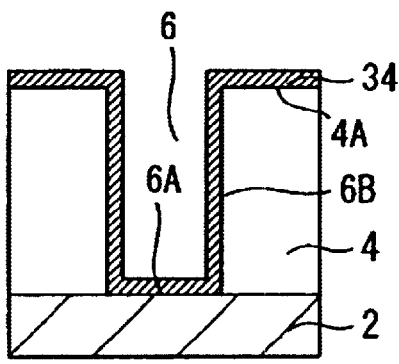
FIG. 6A to FIG. 6E are schematic sectional views for illustrating a conventional contact structure.
Figure 6B:
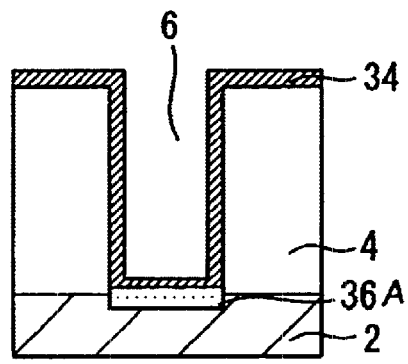
Figure 6C:
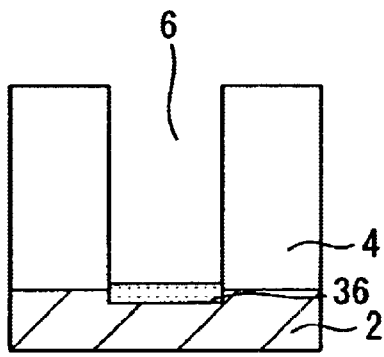
Figure 6D:
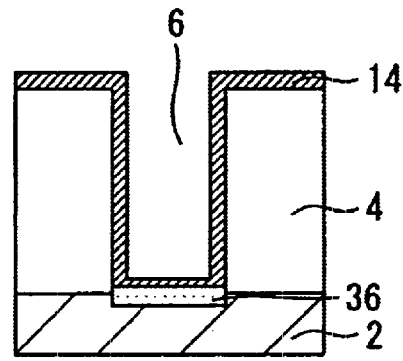
Figure 6E:
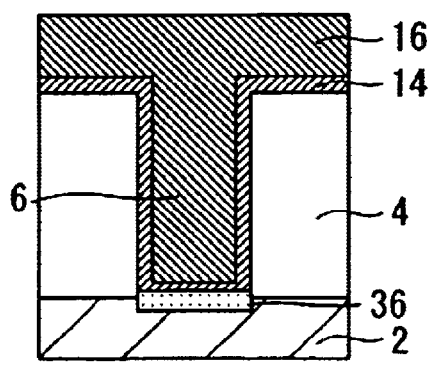

Next, as FIG. 4D shows, the part of the Co film 22 that has not been silicified is removed to leave the $Co_xW_ySi_z$ film 12 in the bottom 6A the connection hole 6.

The substrate is further subjected to a second heat treatment at 650° C. to 900° C. to obtain the stable $Co_xW_ySi_z$ film 12.

Further on the $Co_xW_ySi_z$ film 12, a TiN/Ti film 14 is formed, and a conductive member 16 is buried to obtain a contact structure as the contact structure shown in FIG. 1.

Since other parts are the same as in First Embodiment, description will be omitted.

The $Co_xW_ySi_z$ film 12, which is a ternary metal silicide layer, can also be formed by the above-described method. Therefore, even during the first and second heat treatments, or other heat treatments, no aggregation occurs on the bottom of the connection hole, and the elevation of contact resistance can be prevented.

Here, although W is used as a metal to be implanted into the Si substrate for forming the ternary metal silicide layer, other refractory metals, such as Mo, Ni, and Ta, may also be used, However, Co is preferable to form the film.

The features and the advantages of the present invention as described above may be summarized as follows.

According to an aspect of the present invention, a ternary silicide layer is formed on the bottom of the connection hole, that is, between the barrier layer and the Si substrate that the barrier layer contacts. This refractory metal silicide layer has heat resistance superior to $TiSi_2$ or $CoSi_2$, and a stable state is maintained even at a high temperature. Accordingly, the occurrence of aggregation on the bottom of the connection hole is prevented. Thereby, even if heat treatments at a high temperature are carried out in the semiconductor manufacturing process, the elevation of contact resistance due to aggregation, or breakdown of electrical connections due to the formation of voids, can be prevented.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-203919, filed on Jul. 4, 2001 including specification, claims, drawings and summary, on which the Convention priority of the present application is based, are incorporated herein by reference in its entirety.

What is claimed is:

1. A contact structure, comprising:
   a silicon substrate;
   an insulating layer formed on said substrate, and having a connection hole that reaches a bottom of said insulating layer;
   a barrier layer formed at least on and contacting the inner surface of said connection hole;
   a ternary metal suicide layer formed between said substrate and said barrier layer, said ternary metal silicide layer extending into said substrate; and
   a conductive member on said barrier layer and inside said connection hole, wherein
   the bottom of said insulating film adjoining to said ternary metal silicide layer contacts with the surface of said silicon substrate.

2. The contact structure according to claim 1, wherein said barrier layer is composed of a thin TiN/Ti film.

3. The contact structure according to claim 1, wherein said conductive member is W.

4. A contact structure comprising:
   a silicon substrate;
   an insulating layer formed on said substrate, and having a connection hole that reaches a bottom of said insulating layer;
   a barrier layer formed at least on the inner surface of said connection hole;
   a ternary metal silicide layer formed between said substrate and said barrier layer; and
   a conductive member on said barrier layer and inside said connection hole, wherein said ternary metal silicide layer consists of a compound of Co, W, and Si.

5. The contact structure according to claim 4, wherein said barrier layer is composed of a thin TiN/Ti film.

6. The contact structure according to claim 4, wherein said conductive member is W.

7. The contact structure according to claim 4, wherein said barrier layer includes a different metal from the metals included in said ternary metal silicide layer.

8. A contact structure comprising:
   a silicon substrate;
   an insulating layer formed on said substrate, and having a connection hole that reaches a bottom of said insulating layer;
   a barrier layer formed at least on the inner surface of said connection hole;
   a ternary metal silicide layer formed between said substrate and said barrier layer; and
   a conductive member on said barrier layer and inside said connection hole, wherein said ternary metal silicide layer consists of a compound of Co, Mo, and Si.

9. The contact structure according to claim 8, wherein said barrier layer is composed of a thin TiN/Ti film.

10. The contact structure according to claim 8, wherein said conductive member is W.

11. The contact structure according to claim 8, wherein said barrier layer includes a different metal from the metals included in said ternary metal silicide layer.

12. A method of forming a contact, comprising the steps of:
- forming an insulating layer on an Si substrate;
- forming a connection hole that exposes said Si substrate;
- forming a ternary metal silicide layer on and extending into said Si substrate at the bottom of said connection hole;
- forming a barrier layer at least on and contacting the inner surface of said connection hole after the step of forming a ternary metal silicide layer; and
- forming a conductive member on said barrier layer and inside said connection hole.

13. The method of forming a contact according to claim 12, wherein said step of forming said ternary metal silicide layer comprises the steps of:
- forming a film of a binary refractory metal compound at least containing Co at least on the inner surface of said connection hole;
- forming the ternary metal silicide by allowing said film of said binary refractory metal compound to react with said Si substrate on the bottom of said connection hole to form the silicide by a first heat treatment;
- removing the portion of said film of said binary refractory metal compound that has not been converted to the silicide; and
- stabilizing said ternary metal silicide by a second heat treatment.

14. The method of forming a contact according to claim 13, wherein a $Co_xW_y$ film or a $Co_xMo_y$ film is used as said binary refractory metal compound.

15. The method of forming a contact according to claim 13, wherein said first heat treatment is carried out at a temperature between 400° C. and 450° C., and said second heat treatment is carried out at a temperature between 650° C. and 900° C.

16. The method of forming a contact according to claim 12, wherein said step of forming said ternary metal suicide layer comprises the steps of:
- forming a Co film at least on the inner surface of said connection hole;
- forming a film consisting of a refractory metal on said Co film;
- allowing said Co film and said refractory metal to react with said Si substrate on the bottom of said connection hole by a first heat treatment, to simultaneously form a binary refractory metal compound at least containing Co, and covert the binary refractory metal compound to the ternary metal silicide;
- removing the binary refractory metal compound that has not been converted to the silicide; and
- stabilizing said ternary metal silicide by a second heat treatment.

17. The method of forming a contact according to claim 16, wherein W or Mo is used as said refractory metal.

18. The method of forming a contact according to claim 16, wherein said first heat treatment is carried out at a temperature between 400° C. and 450° C., and said second heat treatment is carried out at a temperature between 650° C. and 900° C.

19. The method of forming a contact according to claim 12,
wherein said step of forming said ternary metal suicide layer comprises the steps of:
- implanting a refractory metal from said connection hole into said Si substrate on the bottom of said connection hole;
- forming a Co film at least on the inner surface of said connection hole;
- allowing said refractory metal, said Co film, and said Si substrate to react to form a ternary refractory metal silicide;
- removing said Co film from the portion that has not converted to the silicide; and
- stabilizing said ternary metal silicide by a second heat treatment.

20. The method of forming a contact according to claim 19, wherein W or Mo is used as said refractory metal.

21. The method of forming a contact according to claim 19, wherein said first heat treatment is carried out at a temperature between 400° C. and 450° C., and said second heat treatment is carried out at a temperature between 650° C. and 900° C.

* * * * *

UNITED STATES PATENT AND TRADEMARK OFFICE
CERTIFICATE OF CORRECTION

PATENT NO.    : 6,657,301 B2
DATED         : December 2, 2003
INVENTOR(S)   : Kazuyoshi Maekawa et al.

It is certified that error appears in the above-identified patent and that said Letters Patent is hereby corrected as shown below:

Title page,
Item [73], Assignee, change "Mitsubishi Denki Kabushiki Kaisha" to -- Renesas Technology Corp. --.

Signed and Sealed this

Twenty-eighth Day of September, 2004

JON W. DUDAS
*Director of the United States Patent and Trademark Office*